357-22 SR
6/2/87 OR H 000,291

United States Statutory Invention Registration [19]

[11] Reg. Number: H291
[43] Published: Jun. 2, 1987

Boos

[54] FULLY ION IMPLANTED JUNCTION FIELD EFFECT TRANSISTOR

[75] Inventor: John B. Boos, Springfield, Va.

[73] Assignee: The United States of America as represented by the Secretary of the Navy, Washington, D.C.

[21] Appl. No.: 861,628

[22] Filed: May 7, 1986

Related U.S. Application Data

[63] Continuation of Ser. No. 471,096, Mar. 1, 1983, abandoned.

[51] Int. Cl.[4] ..... H01L 29/80; H01L 29/64
[52] U.S. Cl. ..... 357/22; 156/643; 156/645; 357/15; 357/67
[58] Field of Search ..... 357/22; 156/643, 645

[56] References Cited

U.S. PATENT DOCUMENTS

| | | | |
|---|---|---|---|
| 3,725,136 | 4/1973 | Morgan | 357/22 |
| 3,914,784 | 10/1975 | Hunsperger | 357/15 |
| 3,967,305 | 6/1976 | Zuleeg | 357/3 |
| 4,145,233 | 3/1979 | Sefick et al. . | |
| 4,163,984 | 8/1979 | Puceh | 357/22 |
| 4,185,291 | 1/1980 | Hirao et al. | 357/22 |
| 4,285,763 | 8/1981 | Coldren | 156/646 |
| 4,310,570 | 1/1982 | Calviello | 357/22 |
| 4,321,613 | 3/1982 | Hughes et al. | 357/22 |
| 4,327,475 | 5/1982 | Asai et al. . | |
| 4,452,646 | 6/1984 | Zuleeg | 148/84 |
| 4,468,851 | 9/1984 | Wieder et al. | 357/22 |
| 4,471,367 | 9/1984 | Chen | 357/22 |

FOREIGN PATENT DOCUMENTS

| | | | |
|---|---|---|---|
| 0986470 | 3/1965 | United Kingdom | 357/22 P |
| 1290419 | 9/1972 | United Kingdom | 357/22 P |

OTHER PUBLICATIONS

J. B. Boos et al., Fully Implanted InP Junction FET's, IEEE Electron Device Letters, vol. EDL-3, pp. 256-258, 1982.
K. J. Sleger et al., Low Noise Ion Implanted InP FET's IEEE Transactions of Electron Devices, vol. ED-28, pp. 1031-1034, 1981.
R. Yeats et al., Research on InGaAs FETs., Final Report on Contract N00014-78-C-0380 AD-A108016, 1981.
Applied Physics Letters, vol. 34, Feb. 1979 by Armiento, pp. 229-231.

*Primary Examiner*—Stephen C. Buczinski
*Assistant Examiner*—Linda J. Wallace
*Attorney, Agent, or Firm*—Robert F. Beers; William T. Ellis; Edward V. Hiskes

[57] ABSTRACT

A method of making a planar junction field-effect transistor in which a semi-insulating substrate of a III-V semiconductor, particularly InP, is ion implanted by two ions to produce both an n-type region and a p-type region. The gate is further defined by selectively etching through the gate-implant region to the source/drain channel.

1 Claim, 6 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

FULLY ION IMPLANTED JUNCTION FIELD EFFECT TRANSISTOR

This application is a continuation, of application Ser. No. 471,096, filed Mar. 1, 1983, now abandoned.

BACKGROUND

1. Field of the Invention

This invention pertains generally to field-effect transistors (FETs) and in particular to junction FETs made by ion implantation from III-V semiconductors.

2. Prior Art

Present-day semiconductor electronics is dominated by silicon technology. However, it is recognized that other semiconducting materials, though lacking silicon's technological maturity, offer the promise of improved speed and performance.

In a microwave FET, the velocity of the charge carriers and parastic elements play important roles in determining its high frequency performance. At low electric fields, charge carrier velocity is proportional to the electric field with the proportionality constant being the drift mobility. However, at higher electric fields the relationship becomes non linear. For Si, the drift velocity reaches a saturation value at fields above $5\times10^4$ V/cm. For GaAs and InP, the drift velocity first reaches a peak and then declines to a saturation value. Since the low-field mobility of silicon is relatively small, the performance of GaAs and InP is expected to be superior to that of Si. InP is expected to operate at higher frequencies than GaAs due to its higher peak velocity. In addition, the higher reverse breakdown voltage and higher thermal conductivity of InP also gives it the potential for outperforming GaAs.

Early device designers, faced with the choice of GaAs, InP and other III-V compounds besides GaAs and InP, picked GaAs because of its perceived technological advantages. The primary FET structure for GaAs is the metal-semiconductor field-effect transistor (MESFET). MESFETs made from GaAs are relatively easy to fabricate because of the large Schottky barrier between the metal and the semiconductor. However, the Schottky barrier for InP and III-V alloys such as InGaAs is too small to easily fabricate Schottky barrier FETs. Thus InP and InGaAs were not extensively pursued for use in FETs.

A junction gate structure in InP circumvents the Schottky barrier problem and early work on diffused JFETs (surface diffusion using Zn dopants) have been reported. Ion implantation of the dopants is an attractive alternative approach since it is highly compatible with the fabrication of planar devices and monolithic circuits. Ion implantation has been used to make FETs from InP but these efforts have been limited to MESFETs. The inventor participated in research leading to the present invention that resulted in a doubly ion implanted InP JFET. However, this device needed to be isolated by an etch which created a mesa structure on which it was difficult to deposit interconnect lines.

SUMMARY OF THE INVENTION

Therefore it is an object of this invention to provide a high frequency field-effect transistor.

It is a further object of this invention to provide a junction field-effect transistor made of III-V semiconducting materials.

It is yet a further object of this invention to provide a simple method of making III-V junction field-effect transistors.

This invention is a method of making a planar JFET from III-V compounds and alloys in which both the n-region and p-regions are ion implanted in a semi-insulating substrate and in which the gate is further defined by selectively etching through the gate-implant region to the source/drain channel.

In one embodiment, InP was used as the substrate, $^{28}Si$ was implanted in the source and drain, and $^{9}Be$ was implanted in the gate region. Plasma etching defined a 1 micrometer gate.

DETAILED DESCRIPTION OF THE INVENTION

Junction field-effect transistors (JFETs) can be easily fabricated in a planar geometry from InP and other III-V semiconductors by double ion implantations which establish both the p-region and the n-region. Although the procedure is set forth in the context of a device made of InP the procedure is quite general and is not limited to InP. In addition, although the example is limited to a discrete device it is readily understood that multiple devices can be fabricated on a single chip to form an integrated circuit.

Figure 1:
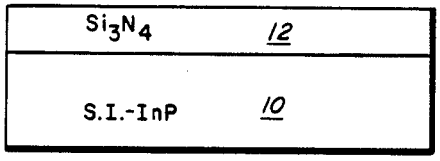
FIG. 1 is a cross-sectional view of the substrate and undefined barrier layer from which the JFET is made.

Referring now to the drawings, wherein like reference numerals designate identical or corresponding parts throughout the several views, and more particularly to FIG. 1 thereof, the JFET fabrication uses a substrate 10 of InP grown by the liquid encapsulated Czochralski method that is Fe-doped to be semi-insulating of resistivity greater than $10^7$ ohm-cm. The surface of the InP substrate has a (100)-orientation. In a first processing step of creating an n-type active region, the substrate is first cleaned with organic solvents and etched in a 1:4 $HIO_3$:$H_2O$ solution. Then a 500 nm thick barrier layer 12 of $Si_3N_4$ is deposited on the (100) surface of the substrate 10. Alternative materials for the barrier 12 are $SiO_2$ or other etchable material.

Figure 2:
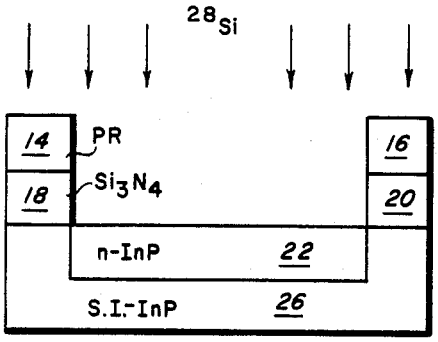
FIG. 2 is a cross-sectional view of the JFET following the first ion implantation.

Thereafter, photoresist is deposited on the barrier layer 12 and photolithographically patterned to leave only photoresist portions 14 and 16 as illustrated in cross-sectional view in FIG. 2. The photoresist then acts as a mask when a plasma etching step removes all the exposed barrier layer but leaves the barrier layer portions 18 and 20.

Then the wafer is ion implanted. The combination of photoresist portions 14 and 16 and barrier portions 18 and 20 serves as a mask so that only an initial active region 22 is implanted in an area 50 micrometers long and 300 micrometers wide. The initial ion implant is chosen to be $^{28}Si$ (isotopic silicon of atomic mass 28) so that the doping in the initial active region 22 is n-type.

Two separate implant schedules are used: $9.4\times10^{12}$ $cm^{-2}$ at 580 keV, $4.6\times10^{12}$ $cm^{-2}$ at 280 keV and $7.0\times10^{12}$ $cm^{-2}$ at 580 keV, $3.5\times10^{12}$ $cm^{-2}$ at 280 keV. The first parameter is the surface density of the implanted ion and the second parameter is the energy of the ion. These implant schedules correspond to calculated atomic concentrations of $^{28}Si$ in the initial active region 22 of $2.5\times10^{17}$ $cm^{-3}$ and $1.9\times10^{17}$ $cm^{-3}$ respectively. The residual substrate 26 that was not implanted is left semi-insulating. The remaining photoresist portions 14 and 16 are then removed.

Figure 3:
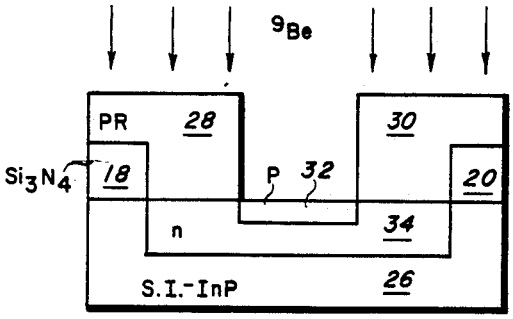
FIG. 3 is a cross-sectional view of the JFET following the second ion implantation.

In a second step of creating a p type region from which a gate is formed, new photoresist is applied in a pattern that defines a channel mask 28 and 30 as illustrated in cross section in FIG. 3. The aperture in the mask is 7 micrometers long. The wafer is then etched in a 1:4 $HIO_3$:$H_2O$ for 30 sec to remove 50 nm of InP from the initial active region 22. This etching time is experimentally determined to yield the desired $I_{DSS}$ levels in the finished devices. Alternatively the $I_{DSS}$ levels can be controlled by varying the parameters of the $^{9}Be$ implant of the implantation step to follow. The etching step further cleans the surface preparatory to the $^{9}Be$ implant and provides registration marks for later processing steps. The barrier portions 18 and 20 are left to serve as additional registration and to insure that the final p-implant overlays the n-implant over the entire width of the active region 34. The p-implant was accomplished by implanting $^{9}Be$ at a dose of $6\times10^{13}$ $cm^{-2}$ at 30 keV resulting in an n-type extended gate region 32 extending part way into the active region 34. The thickness of the n-type active region 34 is thus reduced and the active region 34 can be considered to be divided into three parts, as shown in cross-sectional view in FIG. 4, a source end 36, a drain end 38, and a source/drain channel 40 connecting those ends. Subsequent to the ion implantation the photoresist 28 and 30 is removed by rinsing the wafer with acetone and the barrier portions 18 and 20 of $Si_3N_4$ are stripped by immersion in HF.

When silicon or beryllium is implanted in InP, the chip needs to be annealed after the implant for two reasons. First the implantation produces structural damage to the crystalline InP which needs to be annealed out. Secondly in an annealing step the Be or Si diffuses to the desired lattice locations so that the implanted dopant will be activated.

Unfortunately in a straight-forward anneal of III-V compounds with the surface exposed, the Group V elements tend to dissociate from the surface thus producing a non-stoichiometric III-V semiconductor. Two techniques are commonly available to overcome the dissociation problem. In the first method, the III-V material is coated with a layer of $SiO_2$ or $Si_3N_4$ prior to the anneal. However during the anneal cracking of the $SiO_2$ or $Si_3N_4$ due to thermal stress and possible Si outdiffusion can occur. The second method, called a capless anneal, requires annealing in an over pressure of $PH_3$ (phosphene) or $AsH_3$. Unfortunately both these gases are toxic and thus undesirable in a production environment.

Yet another method has been developed which avoids these problems in what is called a proximity or close-contact anneal. The proximity anneal is accomplished by sandwiching the InP wafer between two silicon wafers coated on the InP side with $Si_3N_4$. The sandwich is then raised to the annealing temperature. The Group V phosphorus dissociates only to the extent that the small void between the InP and the $Si_3N_4$ coating is saturated with phosphorus. The proximity anneal is performed at 700° C. for 15 minutes.

In a third step of placing contacts for the source, gate and drain, the gate is defined by depositing by evaporation a gate metal first layer 42 and second layer 44. Note that these layers have not been drawn to scale in FIG. 4. The gate is placed as close as possible within processing limits to the source end 36 in order to minimize the source-gate resistance. The gate metal first layer 42 consists of AuZn in proportions of 95:5 wt % and is 50 nm thick. The gate metal second layer 44 consists of Au of 350 nm thickness. The first layer 42 and second layer 44 of the gate metal are then commonly defined by conventional photoresist lift-off techniques. Both layers 42 and 44 of the gate metal are 1 micrometers long by 300 micrometers wide in the direction transverse to the cross-section of FIG. 4.

Figure 5:
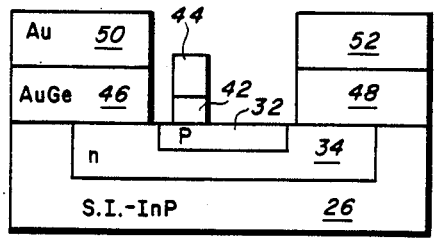
FIG. 5 is a cross-sectional view of the JFET following the deposition of the source/drain metal.

The source/drain contacts are defined by another photolithographic step as illustrated in cross-section in FIG. 5. First layer source and drain metals 46 and 48 are deposited of eutectic AuGe, i.e. in proportions of 88:12 wt % to a thickness of 100 nm. Then second layer source and drain metals 50 and 52 of Au are deposited to a thickness of 100 nm.

Figure 6:
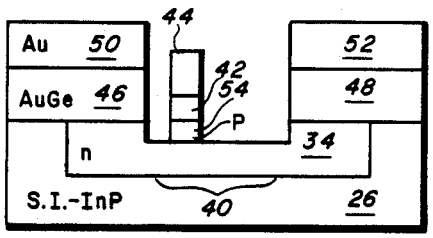
FIG. 6 is a cross-sectional view of the JFET following the gate definition etch.

In a fourth step of isolating the gate region, the structural definition is completed by a $Cl_2$ plasma etch which, as illustrated in FIG. 6, completely etches away the exposed p-type InP. The $Cl_2$ etch proceeds until the reverse gate source I-V characteristic shows low leakage current and a sharp breakdown. The etch leaves only a 1 micrometer long by 300 micrometer wide junction gate 54 overlaying the source/drain channel 40 of the active region 34.

In a fifth and final step, all the metal contacts are alloyed in a forming gas atmosphere at 400° C. for 45 sec. The effect of the elevated temperature is to drive the Ge from the first layer source/drain metals 46 and 48 into the active region 34 and the Zn from the first layer gate metal 42 into the Junction gate 54 thus forming ohmic contacts with the n type and p-type InP.

Metallic interconnects can be deposited on a chip containing many of the devices described above so as to produce an integrated circuit. The JFET is essentially planar so there are no steep steps presenting coverage problems to an interconnect deposition. The only two etches in the final JFET which affect the planarity are the minor one between implants which can be replaced by a more systematic immplant and the gate etch which exposes the channel over which interconnects would not be placed. Neither etch creates a steep edge over which an interconnect would be deposited.

Figure 4:
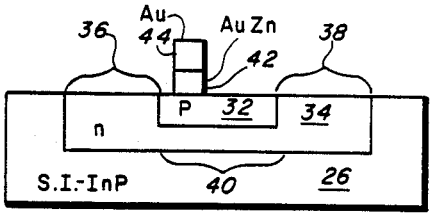
FIG. 4 is a cross-sectional view of the JFET following deposition of the gate metal.

The JFET can be improved by an additional implantation of $^{28}Si$ into the source end 36 and drain end 38 as illustrated in FIG. 4. A high dose will turn these ends 36 and 38 into $n^+$ thereby facilitating the making of ohmic contacts to each and more importantly reducing the source-drain resistance. The low resistance leads to higher frequency performance.

A InP JFET built according to the foregoing description with a gate length of 1 micrometer, a gate width of 300 micrometer, and a source-drain length of 7 micrometer had $I_{DSS}=100$ mA, i.e. saturated drain current, for $V_G=0$. The maximum mutual transconductance $G_m$ is measured to be 8 mS. The gate-source breakdown voltage is found to be 25 V. The device when tested for RF response demonstrates a maximum available gain of 12 dB at 4 GHz, $V_{DS}=12$ V and $V_G=2.1$ V. At 6 GHz, $V_{DS}=9$ V and $V_G=5$ V, the maximum available gain is measured to be 5.5 dB. Improvements in performance are to be expected if the processing parameters were optimized. The optimizing procedure has not yet attempted.

Although a fabrication of an InP JFET has been described, it is to be appreciated that a doubly ion implanted JFET is not limited to InP. The same invention is expected to be particularly useful with InGaAs, an alloy of III-V materials useful for high speed electronics. InGaAs, like InP, exhibits a low Schottky barrier which renders difficult the task of building InGaAs MESFETs. The alloys $InGa_{1-x}As$ with x between 0.35 and 0.65 are expected to be useful for high speed devices. An alloy of the composition $In_{0.53}Ga_{0.47}As$ is particularly useful because of both its speed and its lattice match to InP so that it can be easily grown epitaxially on InP. Yet another favorable III-V alloy is the quatermary alloy. InGaAsP, more accurately written as $In_{1-x}Ga_xAs_yP_{1-y}$. This alloy can be lattice matched over a wide range of alloying. For this invention any of the alloys need to be made semi-insulating, either during growth or during subsequent processing.

Obviously, additional modifications and variations of the present invention are possible in light of the above teachings. It is therefore to be understood that within the scope of the appended claims, the invention may be practiced otherwise than as specifically described herein.

What is claimed and desired to be secured by Letters Patent of the United States is:

1. A field-effect transistor, comprising:

a residual substrate essentially consisting of semi-insulating InP;

an active region essentially consisting of n-type InP doped with Si, the source end and drain end of which have a surface substantially co-planar with the surface of the residual substrate and which are connected by a source/drain channel part of said active region the upper surface of which is recessed below the surface of said source end and said drain end;

a gate consisting of p-type InP doped with Be oerlaying a portion of said source/drain channel but not the entire source/drain channel and contacting said source/drain channel on only one side, a gate contact comprising Au-Zn overlaying said gate;

a drain contact comprising eutectic AuGe overlaying said drain end; and a source contact comprising eutectic AuGe overlaying said source end.

* * * * *